(12) United States Patent
Jang et al.

(10) Patent No.: US 7,372,078 B2
(45) Date of Patent: May 13, 2008

(54) VERTICAL GALLIUM-NITRIDE BASED LIGHT EMITTING DIODE

(75) Inventors: Tae Sung Jang, Suwon (KR); Su Yeol Lee, Seongnam (KR); Seok Beom Choi, Daejeon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 29 days.

(21) Appl. No.: 11/581,003

(22) Filed: Oct. 16, 2006

(65) Prior Publication Data
US 2007/0114552 A1 May 24, 2007

(30) Foreign Application Priority Data
Nov. 23, 2005 (KR) .................. 10-2005-0112162

(51) Int. Cl.
*H01L 33/00* (2006.01)
(52) U.S. Cl. ............... 257/98; 257/76; 257/94; 257/103; 257/184; 257/E33.006; 257/E33.068
(58) Field of Classification Search ............ 257/98, 257/76, 94, 103, 184, 200
See application file for complete search history.

(56) References Cited

U.S. PATENT DOCUMENTS
2006/0154389 A1* 7/2006 Doan .................. 438/21
2007/0295952 A1* 12/2007 Jang et al. .................. 257/15

FOREIGN PATENT DOCUMENTS
KR   2000-0008284   2/2000
KR   10-0613272    8/2006

* cited by examiner

*Primary Examiner*—A. Sefer
(74) *Attorney, Agent, or Firm*—McDermott Will & Emery LLP

(57) ABSTRACT

A vertical GaN-based LED includes: an n-electrode; a light-emitting structure in which an n-type GaN layer, an active layer, and a p-type GaN layer are sequentially formed under the n-electrode; a p-electrode formed under the light-emitting structure; a passivation layer formed to cover the side and bottom surfaces of the light-emitting structure and expose a predetermined portion of the p-electrode, the passivation layer being formed of a distributed Bragg reflector (DBR); a plating seed layer formed under the passivation layer and the p-electrode; and a support layer formed under the plating seed layer.

7 Claims, 3 Drawing Sheets

[FIG. 1]
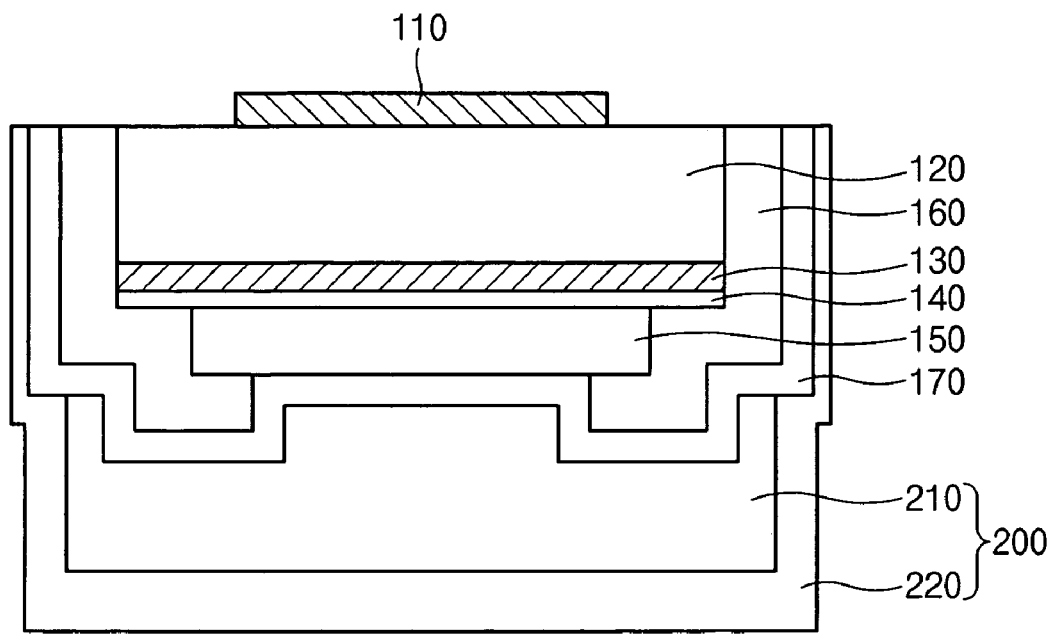
[FIG. 2]
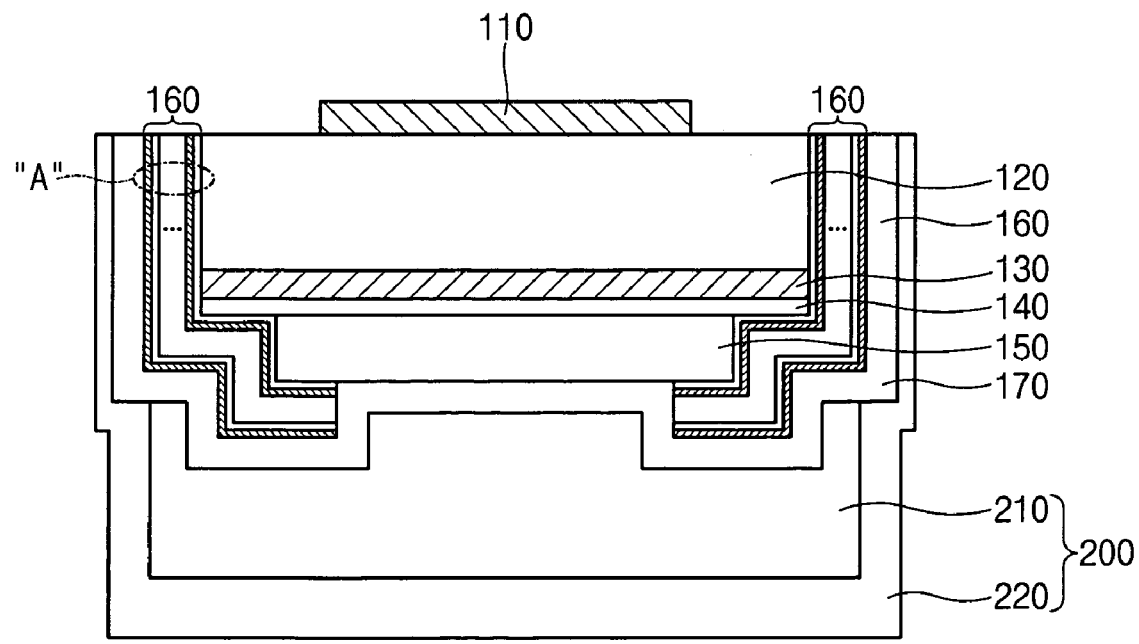

[FIG. 3]
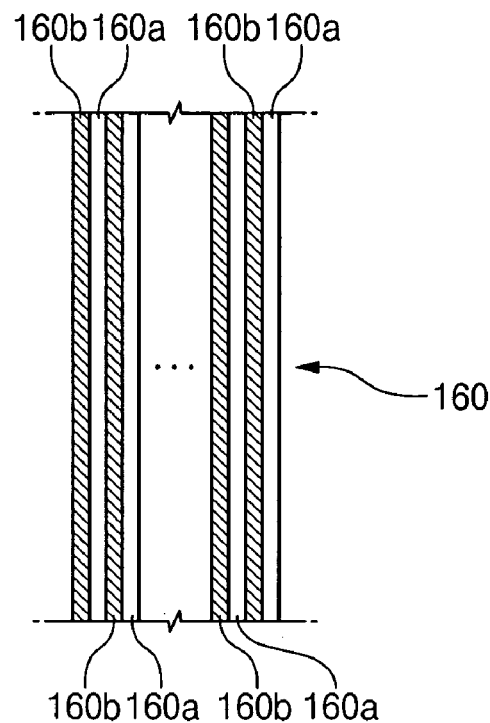
[FIG. 4]
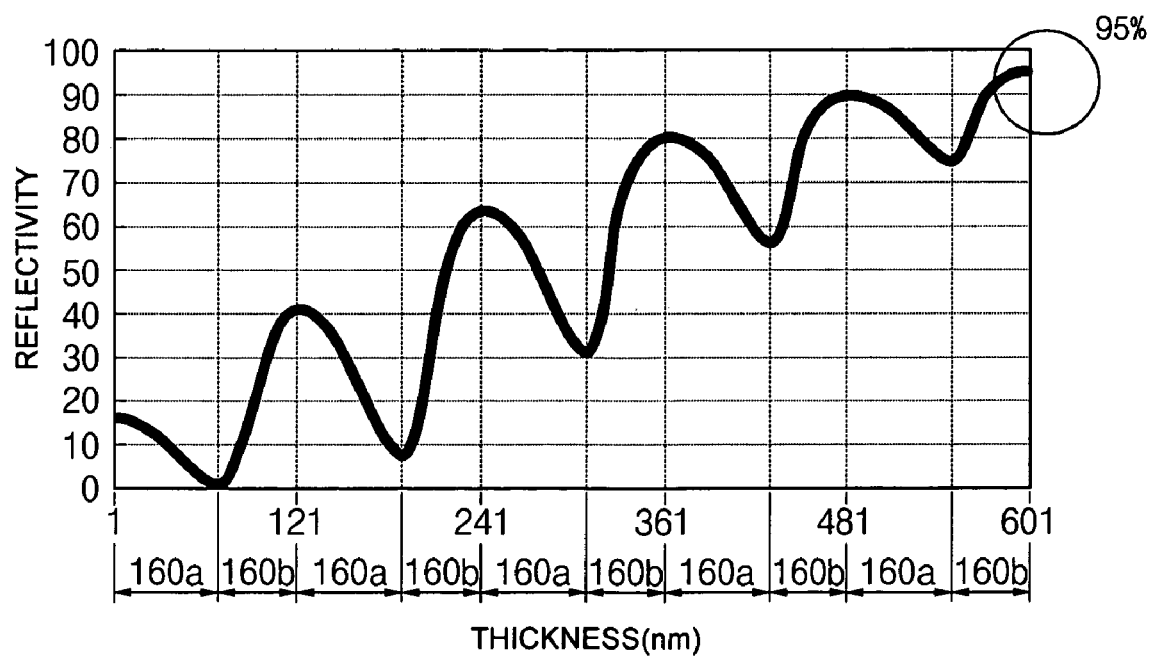

[FIG. 5]
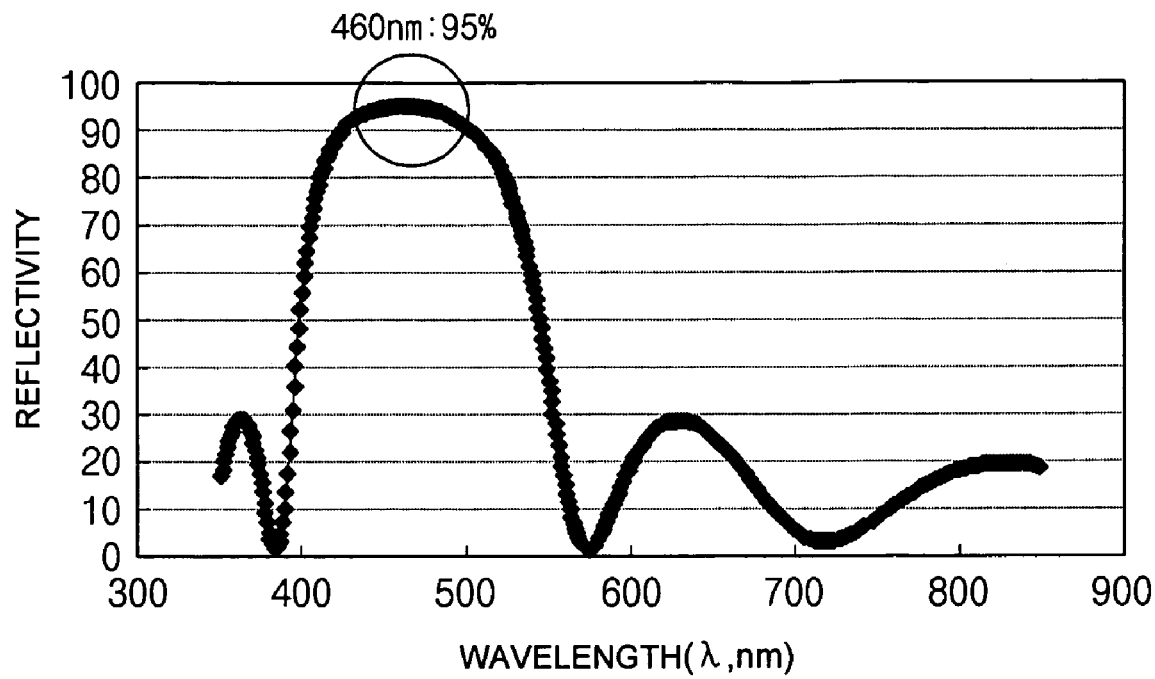
[FIG. 6]
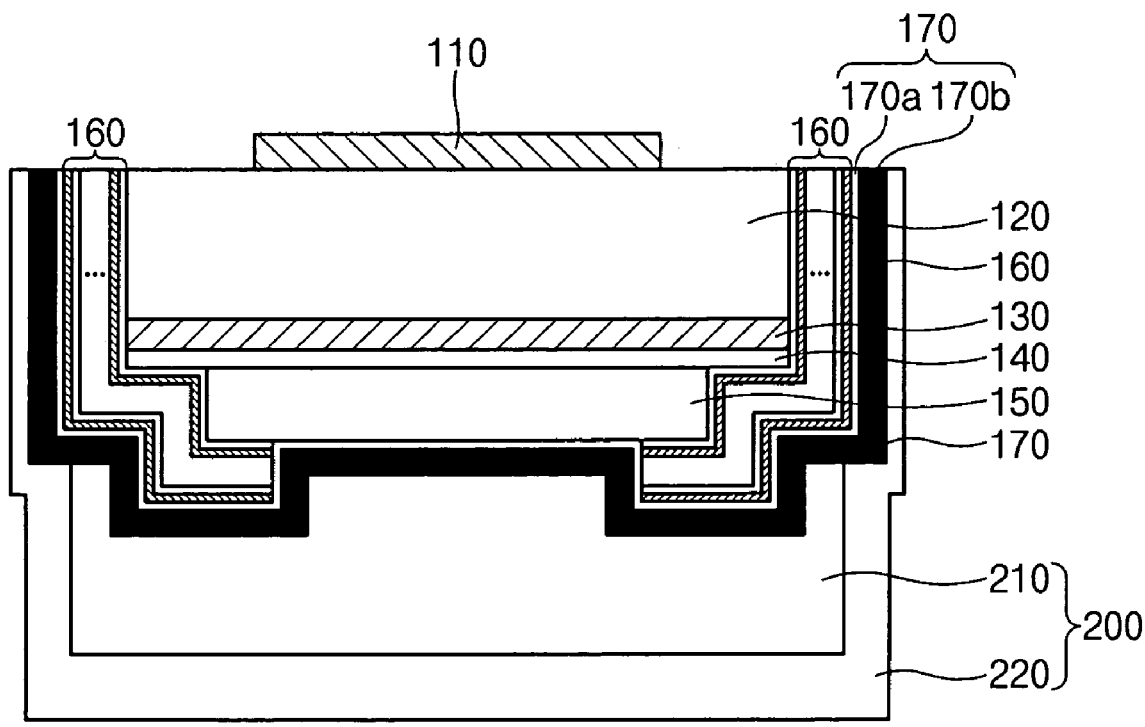

US 7,372,078 B2

VERTICAL GALLIUM-NITRIDE BASED LIGHT EMITTING DIODE

CROSS-REFERENCE TO RELATED APPLICATIONS

This application claims the benefit of Korean Patent Application No. 2005-112162 filed with the Korean Industrial Property Office on Nov. 23, 2005, the disclosure of which is incorporated herein by reference.

BACKGROUND OF THE INVENTION

1. Field of the Invention

The present invention relates to a vertical gallium-nitride (GaN)-based light emitting diode (LED), and more particularly, to a vertical GaN-based LED in which light emitted to a side surface of the vertical GaN-based LED is reflected toward an emission surface, thereby implementing high brightness.

2. Description of the Related Art

Generally, GaN-based LEDs are grown on a sapphire substrate. The sapphire substrate is rigid and electrically nonconductive and has a low thermal conductivity. Therefore, it is difficult to reduce the size of the GaN-based LED for cost-down or improve the optical power and chip characteristics. Particularly, heat dissipation is very important for the LEDs because a high current should be applied to the GaN-based LEDs so as to increase the optical power of the GaN-based LEDs. To solve these problems, a vertical GaN-based LED has been proposed. In the vertical GaN-based LED, the sapphire substrate is removed using a laser lift-off (hereinafter, referred to as LLO) technology.

A conventional vertical GaN-based LED will be described below with reference to FIG. 1.

FIG. 1 is a sectional view of a conventional vertical GaN-based LED. Referring to FIG. 1, the conventional vertical GaN-based LED includes an negative (n-) electrode 110 formed of Cr/Au, a light-emitting structure in which an n-type GaN layer 120, an active layer 130, and a p-type GaN layer 140 are sequentially formed under the n-electrode 110, and a positive (p-) electrode 150 formed of Cr/Au under the light-emitting structure.

A passivation layer 160 is formed under the bottom and side surfaces of the light-emitting structure, except for a predetermined portion of the p-electrode 150 bonded with an external circuit. The passivation layer 160 is formed of an insulating material such as $SiO_2$. The passivation layer 160 prevents the LED from being electrically shorted with its adjacent device.

A support layer 200 is formed on the outermost surfaces of the passivation layer 160 and the p-electrode 150, and supports the vertical GaN-based LED.

A reference numeral 170 represents a plating seed layer acting as a plating crystal nucleus when the support layer 200 is formed using electrolyte plating or electroless plating. Reference numerals 210 and 220 represent first and second plating layers composing the support layer 200.

The plating seed layer is formed of metal, such as Au, Cu, Ta, and Ni, and surrounds the bottom and side surfaces of the light-emitting structure. Therefore, the plating seed layer absorbs some of light emitted from the light-emitting structure, degrading the entire luminous efficiency. That is, because the plating seed layer formed of metal such as Au, Cu, Ta, and Ti has a low reflectivity, it absorbs light directed to the plating seed layer among the light emitted from the active layer. Consequently, the light extraction efficiency is reduced and the brightness is lowered.

SUMMARY OF THE INVENTION

An advantage of the present invention is that it provides a vertical GaN-based LED that can improve the light extraction efficiency. In the vertical GaN-based LED, a passivation layer is formed of a distributed Bragg reflector (DBR) having high reflectivity between a light-emitting structure and a plating seed layer. Therefore, some of light emitted from the light-emitting structure can be prevented from being absorbed or scattered into the plating seed layer.

Additional aspects and advantages of the present general inventive concept will be set forth in part in the description which follows and, in part, will be obvious from the description, or may be learned by practice of the general inventive concept.

According to an aspect of the invention, a vertical GaN-based LED includes: an n-electrode; a light-emitting structure in which an n-type GaN layer, an active layer, and a p-type GaN layer are sequentially formed under the n-electrode; a p-electrode formed under the light-emitting structure; a passivation layer formed to cover the side and bottom surfaces of the light-emitting structure and expose a predetermined portion of the p-electrode, the passivation layer being formed of a distributed Bragg reflector (DBR); a plating seed layer formed under the passivation layer and the p-electrode; and a support layer formed under the plating seed layer.

According to another aspect of the present invention, the DBR includes at least one semiconductor pattern in which a low refractive-index layer and a high refractive-index layer are sequentially formed.

According to a further aspect of the present invention, the low refractive-index layer has a relatively lower refractive index than that of the high refractive-index layer, and the thicknesses of the low refractive-index and the high refractive-index layer, respectively, are $\lambda/4$ of reference wavelength. The number of the semiconductor patterns for the DBR can be determined according to the wavelength of light to be emitted from the LED. Accordingly, the reflectivity of the passivation layer formed of the DBR can be maximized.

According to a still further aspect of the present invention, the plating seed layer is a bi-layer in which an adhesive layer and a reflective layer are sequentially formed. The adhesive layer is formed of metal selected from the group consisting of Cr, Ni, Ti, and alloy thereof. The reflective layer is formed of metal selected from the group consisting of Ag, Al, Pt, and alloy thereof.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a sectional view of a conventional vertical GaN-based LED;

FIG. 2 is a sectional view of a vertical GaN-based LED according to a first embodiment of the present invention;

FIG. 3 is a partial sectional view of a passivation layer illustrated in FIG. 2;

FIG. 4 is a graph illustrating the variation of reflectivity in accordance with thickness change in the passivation layer of FIG. 3;

FIG. 5 is a graph illustrating the variation of reflectivity in accordance with reference wavelength in the passivation layer of FIG. 3; and FIG. 6 is a sectional view of a vertical GaN-based LED according to a second embodiment of the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. In the drawings, the thicknesses of layers and regions are exaggerated for clarity.

Hereinafter, vertical GaN-based LEDs according to the embodiments of the present invention will be described in detail with reference to the accompanying drawings.

Embodiment 1

A vertical GaN-based LED according to a first embodiment of the present invention will be described below with reference to FIGS. 2 and 3.

FIG. 2 is a sectional view of a vertical GaN-based LED according to a first embodiment of the present invention, and FIG. 3 is a partial sectional view of a passivation layer illustrated in FIG. 2.

Referring to FIGS. 2 and 3, an n-type bonding pad (not shown) for electrical connection to an external device is formed on the uppermost portion of the vertical GaN-based LED.

An n-electrode 110 is formed under the n-type bonding pad. It is preferable that the n-electrode 110 is formed of metal having high reflectivity so that it can serve as an electrode and a reflective layer.

An n-type GaN layer 120 is formed under the n-electrode 110. More specifically, the n-type GaN layer 120 may be formed of an n-doped GaN layer or an n-doped GaN/AlGaN layer.

To improve the current spreading efficiency, an n-type transparent electrode (not shown) is further formed on the n-type GaN layer 120 contacting the n-electrode 110.

An active layer 130 and a p-type GaN layer 140 are sequentially formed under the n-type GaN layer 120, thereby forming a light-emitting structure. The active layer 130 may have a multi-quantum well structure of InGaN/GaN layer. Like the n-type GaN layer 120, the p-type GaN layer 140 may be formed of a p-doped GaN layer or a p-doped GaN/AlGaN layer.

A p-electrode 150 is formed under the p-type GaN layer 140. Like the n-electrode 110, the p-electrode 150 is preferably formed of metal having high reflectivity so that it can serve as an electrode and a reflective layer.

A passivation layer 160 is formed on the bottom and side surfaces of the light-emitting structure, except some portion of the p-electrode 150 bonded with an external circuit. The passivation layer 160 prevents the LED from being electrically shorted with its adjacent device.

Specifically, the passivation layer 160 is formed of a distributed Bragg reflector (DBR). The DBR is a reflector that is formed of semiconductor patterns and can obtain the reflectivity of more than 95% in the light of specific wavelength ($\lambda$) by alternately forming two mediums having different refractive index to the thickness of $m\lambda/4n$ ($\lambda$: wavelength of light, n: refractive index of medium, m: odd number). Because the DBR has higher bandgap energy than the oscillation wavelength, the absorption does not occur. As the difference between the two mediums of the semiconductor patterns is greater, the reflectivity increases.

Accordingly, as illustrated in FIG. 3, the passivation layer 160 formed of the DBR includes at least one semiconductor pattern in which a low refractive-index layer 160a and a high refractive-index layer 160b are sequentially formed. At this point, the thicknesses of the low refractive-index layer 160a and the high refractive-index layer 160b, respectively, are $\lambda/4$ of the reference wavelength.

More specifically, the low refractive-index layer 160a of the passivation layer 160 has a relatively lower reflective index than the high refractive-index layer 160b. For example, the low refractive-index layer 160a is formed of $SiO_2$ (n=1.4) or $Al_2O_3$ (n=1.6), and the high refractive-index layer 160b is formed of $Si_3N_4$ (n=2.05-2.25), $TiO_2$ (n=2.1), or Si—H (n=

In this embodiment, the low refractive-index layer 160a is formed of $Al_2O_3$ (n=1.6), and the high refractive-index layer 160b is formed of $Si_3N_4$ (n=2.05-2.25).

Meanwhile, the number of the semiconductor patterns in which the low refractive-index layer 160a and the high refractive-index layer 160b are formed in sequence can be adjusted according to the wavelength of light to be emitted from the LED. As illustrated in FIGS. 4 and 5, the present invention can maximize the reflectivity of the passivation layer formed of the DBR.

FIG. 4 is a graph illustrating the variation of reflectivity in accordance with the thickness change in the passivation layer of FIG. 3, and FIG. 5 is a graph illustrating the variation of reflectivity in accordance with the reference wavelength in the passivation layer of FIG. 3. In this embodiment, the reference wavelength of the passivation layer was 460 nm, and the thickness of the passivation layer was changed in accordance with the reference wavelength.

A plating seed layer 170 is formed on the outermost surfaces of the passivation layer 160 and the p-electrode 150. The plating seed layer 170 serves as a plating crystal nucleus when a support layer is formed using electrolyte plating or electroless plating. The plating seed layer 170 is formed of metal such as Au, Cu, Ta, and Ni.

According to the related art, the plating seed layer 170 absorbs some of light emitted from the light-emitting structure. According to the present invention, however, the passivation layer 160 formed of DBR between the plating seed layer 170 and the light-emitting structure reflects light directed to the plating seed layer 170 and discharges it to the outside. Therefore, compared with the conventional vertical GaN-based LED (see FIG. 1), the vertical GaN-based LED according to the present invention (see FIG. 2) can improve the light extraction efficiency and increase the brightness.

Moreover, the support layer 200 includes a first plating layer 210 and a second plating layer 220. The first plating layer 210 supports the LED and the second plating layer 220 connects the LEDs adjacent to each other, thereby making it possible to mass-produce the LEDs.

Embodiment 2

A vertical GaN-based LED according to a second embodiment of the present invention will be described below with reference to FIG. 6. Description about the same parts as the first embodiment of the present invention will be omitted.

FIG. 6 is a sectional view of a vertical GaN-based LED according to a second embodiment of the present invention.

Referring to FIG. 6, the vertical GaN-based LED according to the second embodiment of the present invention is similar to the vertical GaN-based LED according to the first embodiment of the present invention, but is different in that a plating seed layer 170 is composed of a bi-layer in which an adhesive layer 170a and a reflective layer 170b are sequentially formed, not a single layer formed of metal such as Au, Cu, Ta, and Ni.

The adhesive layer 170a of the plating seed layer 170 is formed of metal having excellent adhesive property with respect to oxide materials. That is, the adhesive layer 170a is formed of metal selected from the group consisting of Cr, Ni, T, and alloy thereof. Therefore, the adhesive force between the plating seed layer 170 and the passivation layer 160 can be increased.

The reflective layer 170b is formed of metal having high reflectivity. That is, the reflectivity layer 170b is formed of metal selected from the group consisting of Ag, Al, Pt, and alloy thereof. The light emitted from the light-emitting structure is reflected through the reflective layer 170b and is directed to the emission surface. Therefore, the light extraction efficiency can be more improved.

The second embodiment of the present invention can obtain the same operation and effect as the first embodiment of the present invention. In addition, because the plating seed layer 170 is formed of the bi-layer of the adhesive layer 170a and the reflective layer 170b, the light emitted from the light-emitting structure can be prevented from being absorbed or scattered into the plating seed layer 170. Consequently, the brightness of the vertical GaN-based LED can be increased, and the adhesive force between the passivation layer 160 and the plating seed layer 170 can be more improved.

As described above, because the passivation layer is formed of DBR having high reflectivity, it reflects the light directed to the plating seed layer. Therefore, it is possible to prevent the light from being absorbed or scattered into the plating seed layer, thereby improving the light extraction efficiency.

Moreover, because the plating seed layer is formed of the bi-layer in which the adhesive layer and the reflective layer are sequentially formed, the adhesive force between the plating seed layer and the passivation layer is improved, and the absorption of light in the plating seed layer can be minimized, thereby improving the light extraction efficiency much more.

Accordingly, the present invention can provide the vertical GaN-based LED having high brightness.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A vertical gallium-nitride (GaN)-based light emitting diode (LED) comprising:
    an n-electrode;
    a light-emitting structure in which an n-type GaN layer, an active layer, and a p-type GaN layer are sequentially formed under the n-electrode;
    a p-electrode formed under the light-emitting structure;
    a passivation layer formed to cover the side and bottom surfaces of the light-emitting structure and expose a predetermined portion of the p-electrode, the passivation layer being formed of a distributed Bragg reflector (DBR);
    a plating seed layer formed under the passivation layer and the p-electrode; and
    a support layer formed under the plating seed layer.

2. The vertical GaN-based LED according to claim 1, wherein the DBR includes at least one semiconductor pattern in which a low refractive-index layer and a high refractive-index layer are sequentially formed.

3. The vertical GaN-based LED according to claim 2, wherein the low refractive-index layer has a relatively lower refractive index than that of the high refractive-index layer.

4. The vertical GaN-based LED according to claim 2, wherein the thicknesses of the low refractive-index and the high refractive-index layer, respectively, are $\lambda/4$ of reference wavelength.

5. The vertical GaN-based LED according to claim 1, wherein the plating seed layer is a bi-layer in which an adhesive layer and a reflective layer are sequentially formed.

6. The vertical GaN-based LED according to claim 5, wherein the adhesive layer is formed of metal selected from the group consisting of Cr, Ni, Ti, and alloy thereof.

7. The vertical GaN-based LED according to claim 5, wherein the reflective layer is formed of metal selected from the group consisting of Ag, Al, Pt, and alloy thereof.

* * * * *